United States Patent
Nagashima et al.

(10) Patent No.: US 6,673,155 B2
(45) Date of Patent: Jan. 6, 2004

(54) APPARATUS FOR FORMING COATING FILM AND APPARATUS FOR CURING THE COATING FILM

(75) Inventors: Shinji Nagashima, Kikuchi-gun (JP); Hiroyuki Miyamoto, Kikuchi-gun (JP); Shizuo Ogawa, Kumamoto (JP); Shinji Koga, Kikuchi-gun (JP)

(73) Assignee: Tokyo Electron Limited, Tokyo (JP)

( * ) Notice: Subject to any disclaimer, the term of this patent is extended or adjusted under 35 U.S.C. 154(b) by 0 days.

(21) Appl. No.: 09/416,953

(22) Filed: Oct. 13, 1999

(65) Prior Publication Data

US 2003/0200918 A1 Oct. 30, 2003

(30) Foreign Application Priority Data

Oct. 15, 1998 (JP) .......................... 10-293372
Oct. 15, 1998 (JP) .......................... 10-293446

(51) Int. Cl.[7] ............................................. B05C 11/00
(52) U.S. Cl. ................... 118/666; 118/64; 118/66; 118/69; 118/707; 118/712
(58) Field of Search ........................ 118/641, 666, 118/707, 712, 59, 64, 66, 69, 725; 427/372.2, 240, 425, 374.1, 398.2, 398.4; 438/935, 715, 795

(56) References Cited

U.S. PATENT DOCUMENTS

| | | | | |
|---|---|---|---|---|
| 5,151,871 A | * | 9/1992 | Matsumura et al. | 364/557 |
| 5,365,772 A | * | 11/1994 | Ueda et al. | 117/86 |
| 5,372,648 A | * | 12/1994 | Yamamoto et al. | 118/723 |
| 5,592,581 A | * | 1/1997 | Okase | 392/418 |
| 5,695,817 A | * | 12/1997 | Tateyama et al. | 427/240 |
| 5,735,961 A | * | 4/1998 | Shimada | 118/715 |
| 5,826,129 A | * | 10/1998 | Hasebe et al. | 396/611 |
| 5,927,077 A | * | 7/1999 | Hisai et al. | 62/3.3 |
| 6,051,101 A | * | 4/2000 | Ohtani et al. | 156/345 |
| 6,183,562 B1 | * | 2/2001 | Pierce et al. | 118/707 |
| 6,203,969 B1 | * | 3/2001 | Ueda | 430/330 |
| 6,261,365 B1 | * | 7/2001 | Matsuyama et al. | 118/50 |

* cited by examiner

Primary Examiner—Richard Crispino
Assistant Examiner—George R. Koch, III
(74) Attorney, Agent, or Firm—Oblon, Spivak, McClelland, Maier & Neustadt, P.C.

(57) ABSTRACT

An apparatus for forming a coating film comprising, a coating unit for forming a coating film by applying a coating solution onto a substrate, and a curing unit for curing the coating film by applying a heating and a cooling to the substrate, in which, the curing unit comprises a heating chamber having a hot plate for heating substrates having the coating solution applied thereon one by one, a cooling chamber communicated with the heating chamber and having a cooling plate for cooling the substrates processed with heat, an inert gas supply mechanism for supplying an insert gas to the heating chamber and the cooling chamber, and an evacuation mechanism for evacuating each of the heating chamber and the cooling chamber.

18 Claims, 7 Drawing Sheets

APPARATUS FOR FORMING COATING FILM AND APPARATUS FOR CURING THE COATING FILM

BACKGROUND OF THE INVENTION

The present invention relates to an apparatus for forming a coating film (coating film formation apparatus) by coating a solution for an interlayer dielectric film on a substrate in a manufacturing process of a semiconductor device, and an apparatus for curing the coating film for the interlayer dielectric film on the substrate.

The manufacturing process for a semiconductor device includes a step of forming an interlayer dielectric film (hereinafter referred to as "ILD") in accordance with a Spin on Dielectric (hereinafter referred to as "SOD") system. The interlayer dielectric film formation methods in accordance with the SOD system include a Sol-Gel method, a SiLK method, SPEED FILM method, and a FOx method. In each of these methods, a solution for forming the interlayer dielectric film is spin-coated on a substrate. The film thus coated is cured by annealing in the SiLK method, SPEED FILM method, and FOx method except the Sol-Gel method.

In such an annealing process, a plurality of wafers having a coating film thereon are loaded into a heating furnace in lots. After heating at a high temperature for a predetermined time, the wafers are unloaded from the heating furnace in lots, transferred to a cooling unit by way of a transfer passage, and cooled to a predetermined temperature.

However, the annealing (thermosetting) is performed in a batch since the wafers of a single lot are heated in a furnace of a high temperature. Therefore, it is impossible to accurately control temperature of the wafers one by one.

In addition, although the annealing treatment is performed in an inert gas ambient, it is difficult to control the concentration of the inert gas when the semiconductor wafer is transferred to a cooling unit after the heating process. In other words, it is difficult to maintain a low oxygen concentration. As a result, the interlayer dielectric film may be oxidized. For these reasons, it has been strongly desired that the wafers are annealed one by one by a single-wafer processing method using a hot plate while preventing oxidation of the interlayer dielectric film.

However, since the interlayer dielectric film is annealed at a high temperature, a temperature sensor used in a hot plate of a conventional apparatus and an inter-lock sensor for preventing an excessive temperature increase cannot be used. Therefore, if the annealing is performed by the hot plate, it is difficult to control temperature. In addition, even if only the annealing is performed by a single wafer processing method, it is impossible to overcome an oxidation problem of the interlayer dielectric film.

BRIEF SUMMARY OF THE INVENTION

An object of the present invention is to provide an apparatus for forming a coating film and an apparatus for curing the coating film capable of controlling substrates one by one when the substrates having a coating film thereon are cured while preventing oxidation of the coating film efficiently.

According to the present invention, there is provided an apparatus for forming a coating film comprising;
  a coating unit for forming a coating film by applying a coating solution onto a substrate; and
  a curing unit for curing the coating film by applying a heating and a cooling to the substrate.

The curing unit comprises
  a heating chamber having a hot plate for heating substrates having the coating solution applied thereon, one by one;
  a cooling chamber communicated with the heating chamber and having a cooling plate for cooling the substrates processed with heat;
  an inert gas supply mechanism for supplying an insert gas to the heating chamber and the cooling chamber; and
  an evacuation mechanism for evacuating the heating chamber and the cooling chamber.

It is preferable that the apparatus further comprise, a power source for supplying a power to the hot plate; a first and second temperature sensors for detecting temperature of the hot plate; setting means for setting a first specified temperature which is an upper limit of a temperature range suitable for curing the coating solution and for setting a second specified temperature which is higher than the first specified temperature, a controller and a temperature controller for controlling the power supply such that when temperature detected by the first temperature sensor exceeds the first specified temperature, power supply to the hot plate is terminated, and when the temperature detected is lower than the first specified temperature, power supply to the hot plate is initiated; and an excessive temperature increase detector for terminating power supply to the hot plate when temperature detected by the second temperature sensor exceeds the second specified temperature and maintaining an OFF state of power supply.

In this case, it is desirable that the apparatus further comprise, a relay connected to each of the temperature controller, controller, excessive temperature increase detector and hot plate, for opening and closing a power supply circuit from the power source to the hot plate, that the controller output an opening signal to the relay when power supply to the hot plate is terminated, and that the excessive temperature increase detector output an opening signal to the relay when power supply to the hot plate is terminated.

According to the present invention, there is provided an apparatus for curing a coating film comprising;
  a heating chamber having a hot plate for heating substrates coated with a coating solution, one by one;
  a cooling chamber communicating with the heating chamber, for cooling the substrate processed with heat;
  an inert gas supply mechanism for supplying an inert gas to the heating chamber and the cooling chamber; and
  an evacuation mechanism for evacuating the heating chamber and the cooling chamber;

According to the present invention, since an inert gas is supplied to each of the heating chamber and cooling chamber, the heating and cooling can be performed continuously under an atmosphere low in oxygen concentration and the coating film can be sufficiently prevented from being oxidized.

Furthermore, the temperature of the hot plate is detected by using two different temperature sensors and the temperature of the hot plate is controlled on the basis of these detection temperatures. Even if the temperature of the hot plate increases to a high temperature region which a conventionally-employed apparatus cannot control, a thermocouple can control it. In addition, power supply to the hot plate is mechanically terminated by the excessive temperature increase detector. Therefore, it is possible to prevent an excessive increase in temperature of the hot plate. Note that a thermocouple and a platinum resistance temperature sensor may be preferably used as the temperature sensor.

A shutter is provided for blocking the heating chamber and the cooling chamber in the curing unit. Therefore, it is possible to prevent thermal interference between these chambers.

Furthermore, it is preferable that the heating chamber have a ring shutter surrounding an outer periphery of the substrate placed on the hot plate during heating and a lifting mechanism for moving the ring shutter upward and downward. With this constitution, uniformity in temperature of the substrate over the entire surface can be further improved.

In the apparatus for forming a coating film according to the present invention, the curing unit for curing a coating film has a heating chamber for heating a substrate and a cooling chamber for cooling a substrate processed with heat, are provided so as to communicate with each other. In addition, an inert gas is supplied to each of the heating chamber and the cooling chamber. Therefore, the heating and the cooling can be continuously performed under an atmosphere low in oxygen concentration and the coating film is fully prevented from being oxidized.

According to the present invention, wafers are processed one by one in a heating chamber. It is therefore possible to accurately control the wafers one by one. In addition, heat can be kept applying uniformly to the entire surface of the wafer in the hating process. Furthermore, due to the single wafer processing, the wafers can be controlled one by one unlike a conventional case in which the wafers are controlled in lots. It is therefore possible to improve the threshold of the wafer in the heating process.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

DETAILED DESCRIPTION OF THE INVENTION

Now, various preferable embodiments of the present invention will be explained with reference to the accompanying drawing.

Figure 1A:
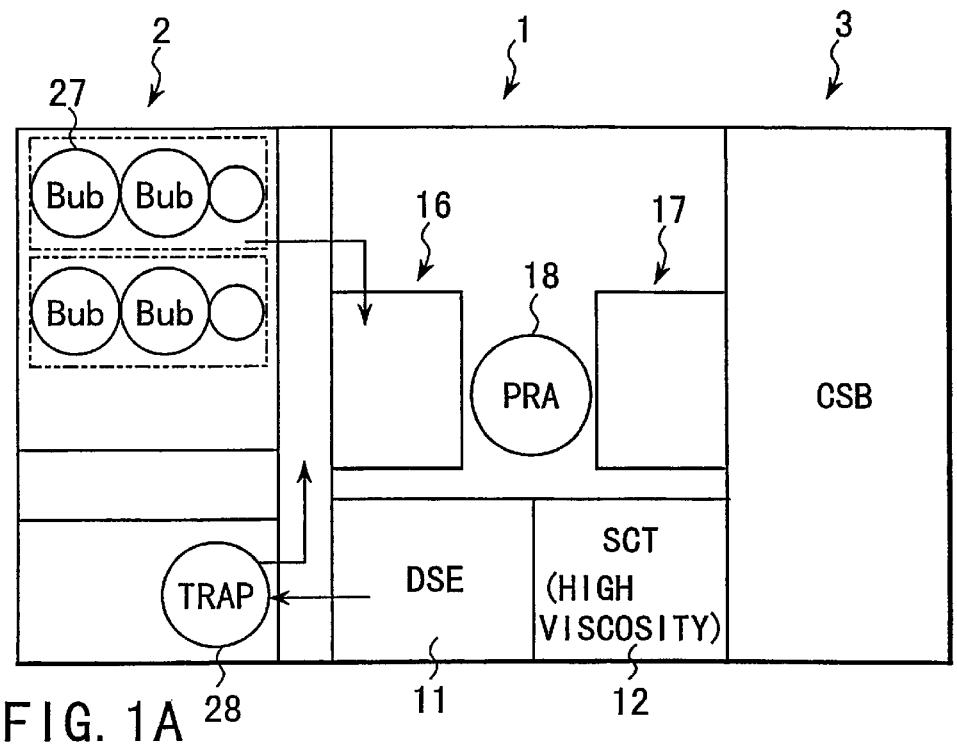
FIG. 1A and FIG. 1B are schematic plan views respectively showing an upper stage and a lower stage of a coating film formation apparatus (Spin on Dielectric system) according to an embodiment of the present invention.
Figure 1B:
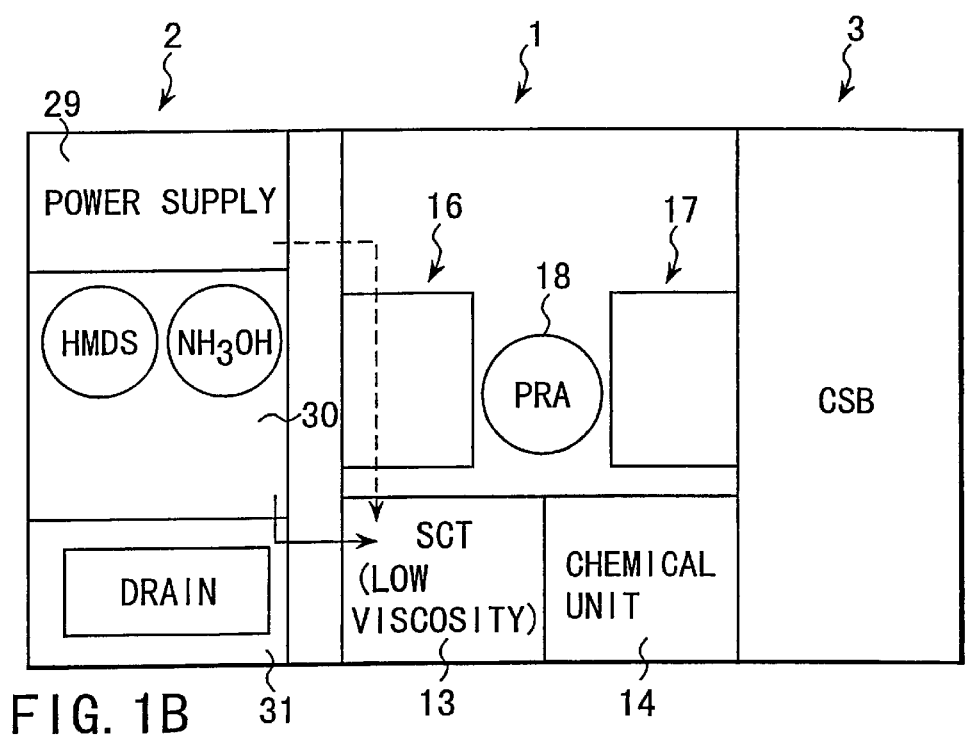

As shown in FIGS. 1A and 1B, the SOD system of an embodiment of the present invention has a process section 1, a side cabinet 2, and a carrier station (CSB) 3.

Figure 2:
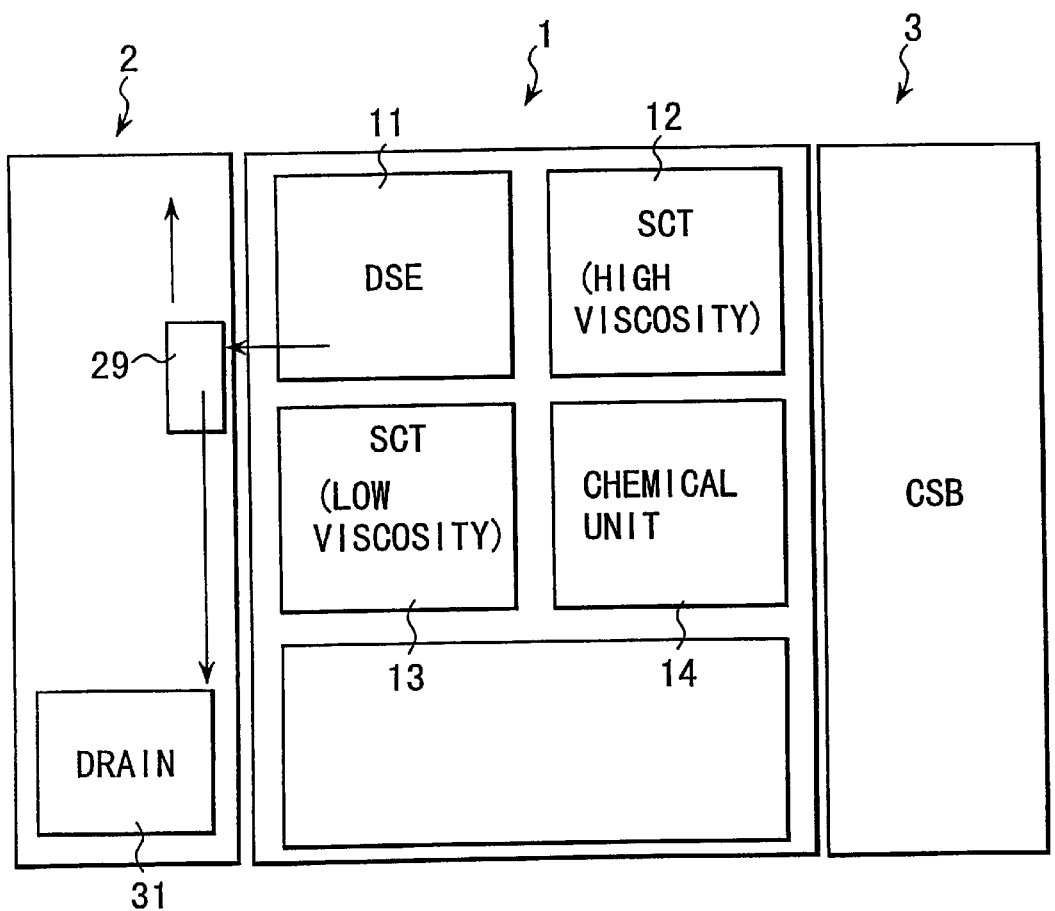
FIG. 2 is a side view of the coating film formation apparatus (SOD system) according to an embodiment of the present invention.

In a front surface of an upper stage of the process section 1, a solvent exchange unit (DSE) 11 and a first coating unit (SCT) 12 are arranged as shown in FIG. 1A and FIG. 2. A coating solution supply source (not shown) storing a high-viscosity coating solution is placed in the first coating unit (SCT) 12. Note that the solvent exchange unit (DSE) 11 and the first coating unit (SCT) 12 have temperature controlling means for controlling temperature of a solvent and the high-viscosity coating solution, respectively.

In a front surface of the lower stage of the process section 1, a second coating unit (SCT) 13 and a chemical unit 14 are arranged as shown in FIGS. 1B and 2. A coating solution supply source (not shown) storing a low-viscosity coating solution is placed in the second coating unit (SCT) 13. A tank (not shown) of the chemical unit 14 stores a chemical agent, pure water, or the like.

At a center of the process section 1, process unit groups 16, 17 formed by stacking a plurality of process units vertically in multiple stages, are arranged as shown in FIGS. 1A and 1B. A transfer mechanism 18 for transporting a wafer W is interposed between these process unit groups 16, 17.

Figure 3:
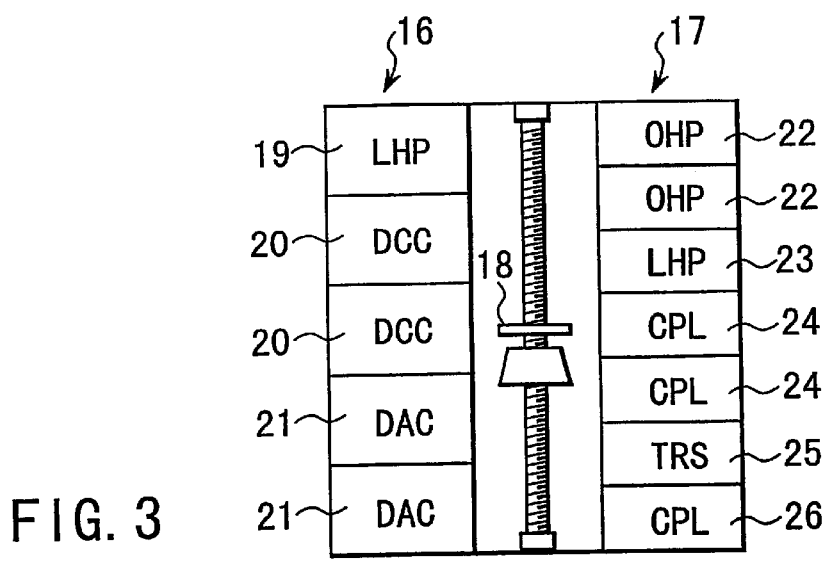
FIG. 3 is a side view of two process unit groups formed by stacking a plurality of process units in multiple layers and installed in the coating film formation apparatus (SOD system)

As shown in FIG. 3, the process unit group 16 is constituted of a hot plate unit (LHP) 19 for heating low-temperature, two DCC process units 20, and two aging units (DAC) 21 stacked in the order mentioned from above. The process unit group 17 is constituted of two hot plate units (OHP) 22 for heating high-temperature, a hot plate unit (LHP) 23 for heating high-temperature, two cooling plate units (CPL) 24, a transfer unit 25, and a cooling plate unit (CPL) 26 stacked in the order mentioned from above. Note that the transfer unit (TRS) 25 can serve as a stand-by portion for the cooling plate.

In the upper stage of the side cabinet 2, a plurality of bubblers (bubble generators) 27 and a trap (TRAP) 28 are arranged. The trap is used for cleaning an exhausting gas. On the other hand, in the lower stage of the side cabinet 2, a power supply source 29, a chemical agent chamber 30, and a drain 31 are arranged. The agent chamber 30 stores a chemical agent such as hexamethyldisilazane (HMDS) or ammonia.

The bubbler 27 has a tank (not shown) for storing ammonia water ($NH_4OH$) and a porous nozzle (not shown) formed at the bottom of the tank. The porous nozzle is connected to a gas supply source (not shown) so that ammonia gas ($NH_3$) is supplied to the porous nozzle. When ammonia gas is supplied to the porous nozzle, it is blown into the ammonia water in the tank, generating water vapor containing a hydroxyl group ($OH^-$). The water vapor is supplied to the process unit group 16. Note that the bubbler 27 is desirably arranged near the process unit group 16 including a heat process unit for preventing the generated water vapor from causing condensation. The side cabinet 2 is desirably arranged at the longest possible distance from the carrier station (CSB) 2 so that the side cabinet 2 is not influenced by ammonia or HMDS.

Now, we will briefly explain the case where the interlayer dielectric film is formed on the wafer W using the SOD system in accordance with, for example, the Sol-Gel method.

The wafer W is transferred from the carrier station (CSB) 3 to the transfer unit (TRS) 25. The wafer W is transferred by the transfer mechanism 18 to the cooling plates (CPL) 24, 26. After controlled in temperature there, the wafer W is transferred to the coating units (SCT) 12, 13, in which a coating solution having colloidal tetraethoxy silane (TEOS; $Si(OC_2H_5)_4$) dispersed in an organic solvent such as an ethanol solution is coated on the wafer W. Thereafter, the sol on the wafer W is changed into gel in the aging unit (DAC) 21 and then, the solvent is exchanged in the solvent exchange (DSE) 11. Thereafter, the wafer W is appropriately heated by the hot plates (LHP) 19, 23 and the hot plates (OHP) 22 and returned to the carrier station (CSB) 3 by the transfer mechanism (TCP) 25. Note that, in the case of the Sol-Gel method, the curing performed in the DCC unit 20 is not required.

Next, we will explain the case where the interlayer dielectric film is formed by the SiLK method, the SPEED FILM method, or the FOx method using the SOD system.

The wafer W is transferred to the cooling plate units (CPL) 24, 26 by the transfer mechanism 18 and cooled there. The wafer W is then transferred to the coating unit (SCT) 13 in which a low-viscosity coating solution is used. After the low-viscosity coating solution is applied onto the wafer W, the wafer W is heated by the hot plates (LHP) 19, 23, cooled in the cooling plate units (CPL) 24, 26, and coated with a high-viscosity coating solution in the first coating unit (SCT) 12. Thereafter, the wafer W is heated in the low temperature hot plate units (LHP) 19, 23, heated in the hot plate unit (OHP) 22, and loaded into the DCC unit 20. In the DCC unit 20, the wafer W is heated and cooled under an atmosphere containing oxygen in a low amount. In this manner, the interlayer dielectric film is cured.

Now, referring to FIGS. 4–7, the DCC unit 20 serving as a curing apparatus will be explained.

Figure 4:
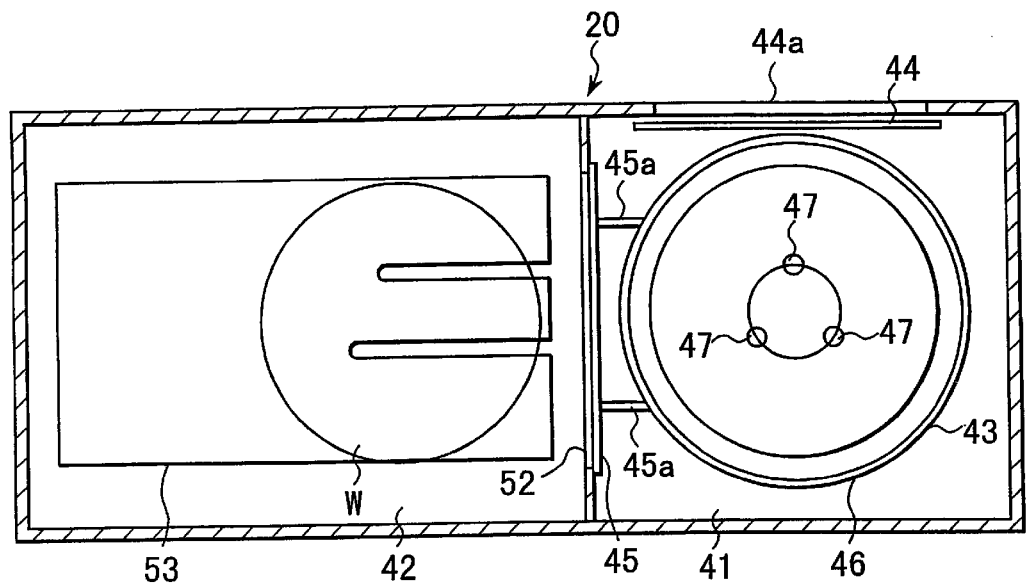
FIG. 4 is a schematic plan view of a curing apparatus (Dielectric Oxygen Density Controlled Cure and Cooling-off unit: DCC unit) according to an embodiment of the present invention.
Figure 5:
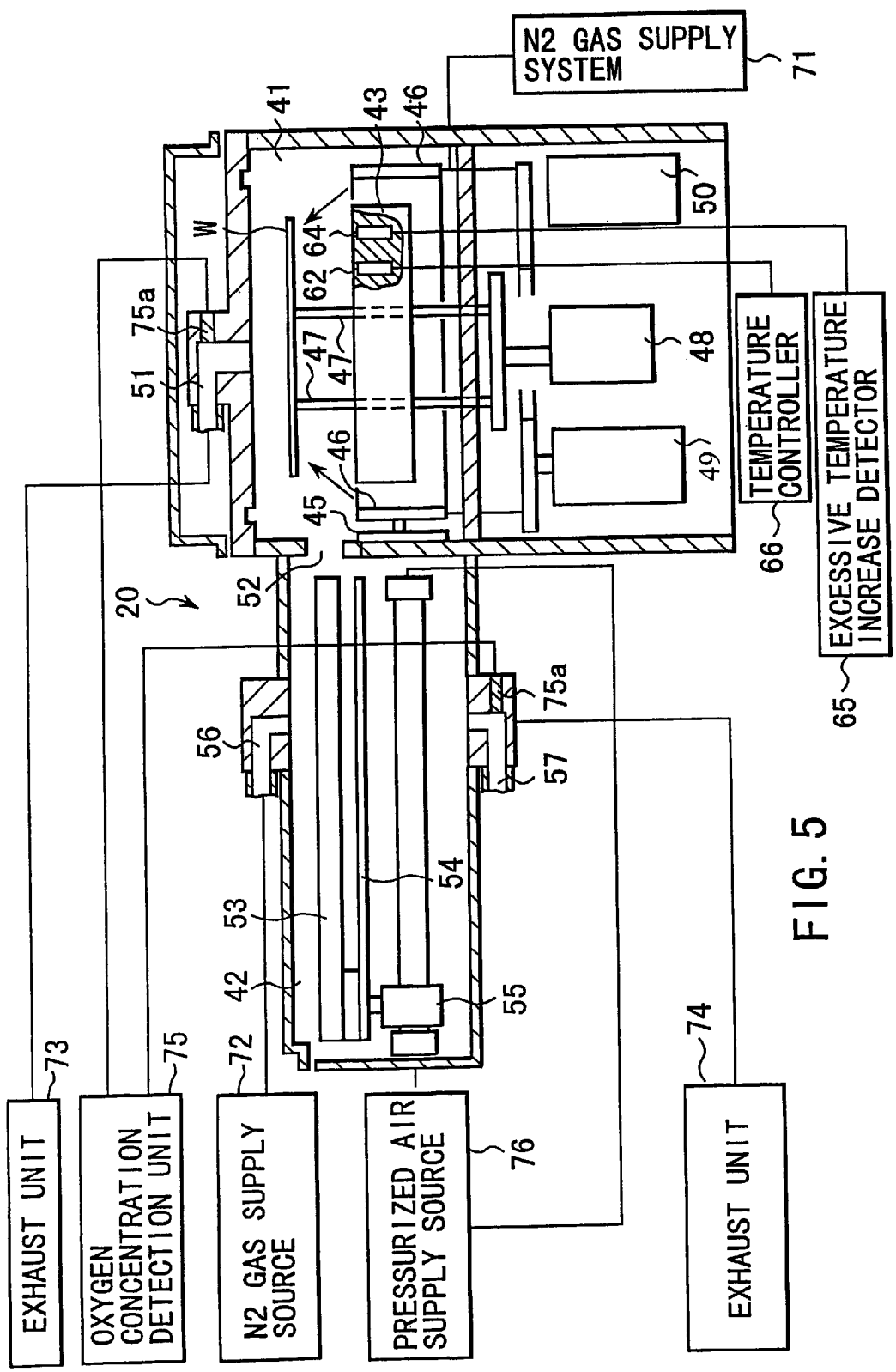
FIG. 5 is a schematic sectional view of the DCC unit shown in FIG. 4, with a block diagram of the peripheral structural elements.

As shown in FIGS. 4 and 5, the DCC unit 20 has a heating chamber 41 and a cooling chamber 42. The heating chamber 41 has a hot plate 43 whose temperature can be set at 200 to 470° C. The hot plate 43 has a first temperature sensor 62 and a second temperature sensor 64 buried therein to check temperature of the hot plate 43. The first temperature sensor 62 is connected to a circuit of the temperature controller 66. The second temperature sensor 64 is connected to a circuit of an excessive temperature increase detector 65. This embodiment employs a platinum (Pt) resistance temperature sensor as the first temperature sensor 62 and employs a platinum-platinum rhodium thermocouple as the second temperature sensor 64. Note that the resistance temperature sensor or the thermocouple may be used as the first and second temperature sensors 62, 64.

The heating chamber 41 and cooling chamber 42 are arranged side by side. The both chambers 41 and 42 are communicated with each other through a loading port 52 in order to load/unload the wafer W therethrough.

The DCC process unit 20 has the first and second gate shutters 44, 45 and a ring shutter 46. The first gate shutter 44 is attached to a loading port 44a of the heating chamber 41. When the first gate shutter 44 is opened, the loading port 44a is automatically opened to load/unload the wafer W into the heating chamber 41 by the main transfer mechanism 18. The second gate shutter 45 is provided at the loading port 52 between the heating chamber 41 and the cooling chamber 42. The second gate shutter 45 is movably supported by a cylinder mechanism 49. When the shutter 45 is moved down, a loading port 52 is opened. When the shutter 45 is moved up, the loading port 52 is closed.

As shown in FIG. 4, the ring shutter 46 is provided so as to surround the hot plate 43. The ring shutter 46 and the hot plate 43 are substantially concentrically arranged. The ring shutter 46 and the hot plate 43 keep substantially the same distance to each other. The rod of the ring shutter 46 is connected to the second gate shutter 45 by members 45a. Both shutters 45, 46 are moved up and down together by the cylinder 49.

Figure 6:
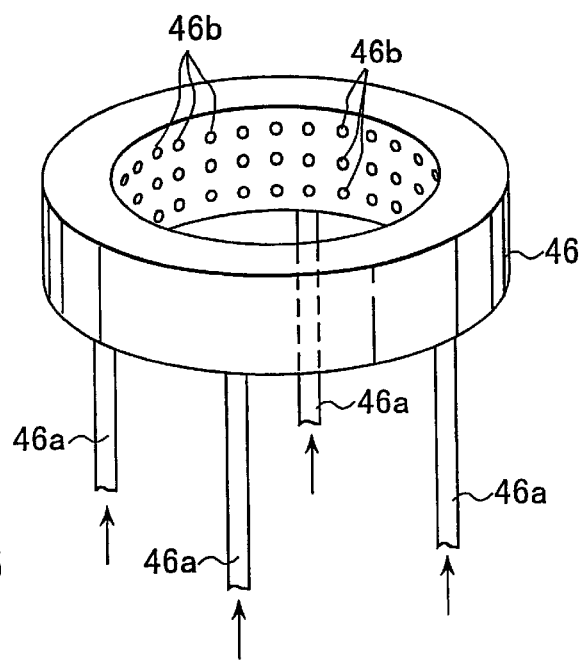
FIG. 6 is a perspective view of a ring shower nozzle of the curing apparatus (the DCC unit)

As shown in FIG. 6, numerous holes 46b are formed in an inner peripheral surface of the ring shutter 46. These holes 46b are communicated with a gas reservoir (header) of the ring shutter 46. The gas reservoir (not shown) is communicated with a $N_2$ gas supply source 71 (FIG. 5) via a plurality of gas supply tubes 46b. When $N_2$ gas is supplied from the $N_2$ gas supply source 71 to the gas supply tubes 46b, $N_2$ gas is blown out uniformly from individual holes 46b. Note that the gas blow-out holes 46b are formed in order for the gas to blow out virtually horizontally.

Furthermore, three lift pins 47 are formed on an upper surface of the hot plate 43 (wafer mounting surface) so as to protrude or retreat from the upper surface. The lift pins 47 are connected to a rod of a cylinder 48 via a member and thus supported by the cylinder 48. Note that a shielding board screen may be interposed between the hot plate 43 and the ring shutter 46.

Three cylinder mechanisms 48, 49, 50 are arranged in a lower portion of the heating chamber 41. The cylinder mechanism 48 moves the lift pins 47 upward and downward. The cylinder mechanism 49 moves the ring shutter 46 and the second gate shutter 45 upward and downward. The cylinder mechanism 50 moves the first gate shutter 44 upward and downward.

As shown in FIG. 5, $N_2$ gas is supplied to the heating chamber 41 from the $N_2$ gas supply source 71 through the ring shutter 46 and exhausted through an upper exhaust pipe 51. The $N_2$ gas supply source 71 and an exhaust unit 73 are controlled together by a controller 60 shown in FIG. 8. The inner pressure of the heating chamber 41 is controlled at, for example, 50 ppm or less, by the balance between the gas supply from the $N_2$ gas supply source 71 and the gas release by the exhaust unit 73. As described, an atmosphere low in oxygen concentration can be maintained by attaining a low inner pressure of the heating chamber 41.

The heating chamber 41 and the cooling chamber 42 are communicated with each other through the loading port 52. A cooling plate 53 for mounting and cooling the wafer W is movably supported by a horizontal cylinder mechanism 55 along a guide plate 54. The horizontal cylinder mechanism 55 is communicated with a pressurized air supply source 76 serving as a driving source. The cooling plate 53 is loaded into the heating chamber 41 through the loading port 52 by the cylinder mechanism 55, receives the wafer already heated by the hot plate 43 in the heating chamber 41 from the lift pins 47, and load it into the cooling chamber 42. After the wafer W is cooled, the wafer W is returned onto the lift pins 47.

Note that the cooling plate 53 is set at a temperature within the range of, for example, 15 to 25° C. Temperature of the wafer W to be subjected to the cooling process falls within the range of 200 to 470° C.

$N_2$ gas is introduced into the cooling chamber 42 from the $N_2$ gas supply source 72 through an upper supply tube 56 and exhausted therefrom through a lower exhaust pipe 57 by an exhaust unit 74. The $N_2$ gas supply source 72 and the exhaust unit 74 are controlled together by the controller 60 shown in FIG. 8. The inner pressure of the cooling chamber 42 is controlled at, for example, 50 ppm or less by the balance between the gas supply from the $N_2$ gas supply source 72 and the gas release by the exhaust unit 74. As described, a low-oxygen concentration of the atmosphere can be maintained by attaining a low inner pressure of the cooling chamber 42.

Note that an oxygen sensor 75a is attached to an exhaust passage 51 of the heating chamber 41 and an exhaust passage 57 of the cooling chamber 42 to detect oxygen concentrations of chambers 41, 42 by an oxygen concentration detector 75. The oxygen concentration detector 75 sends an oxygen concentration detection signal to the controller 60.

Figure 7:
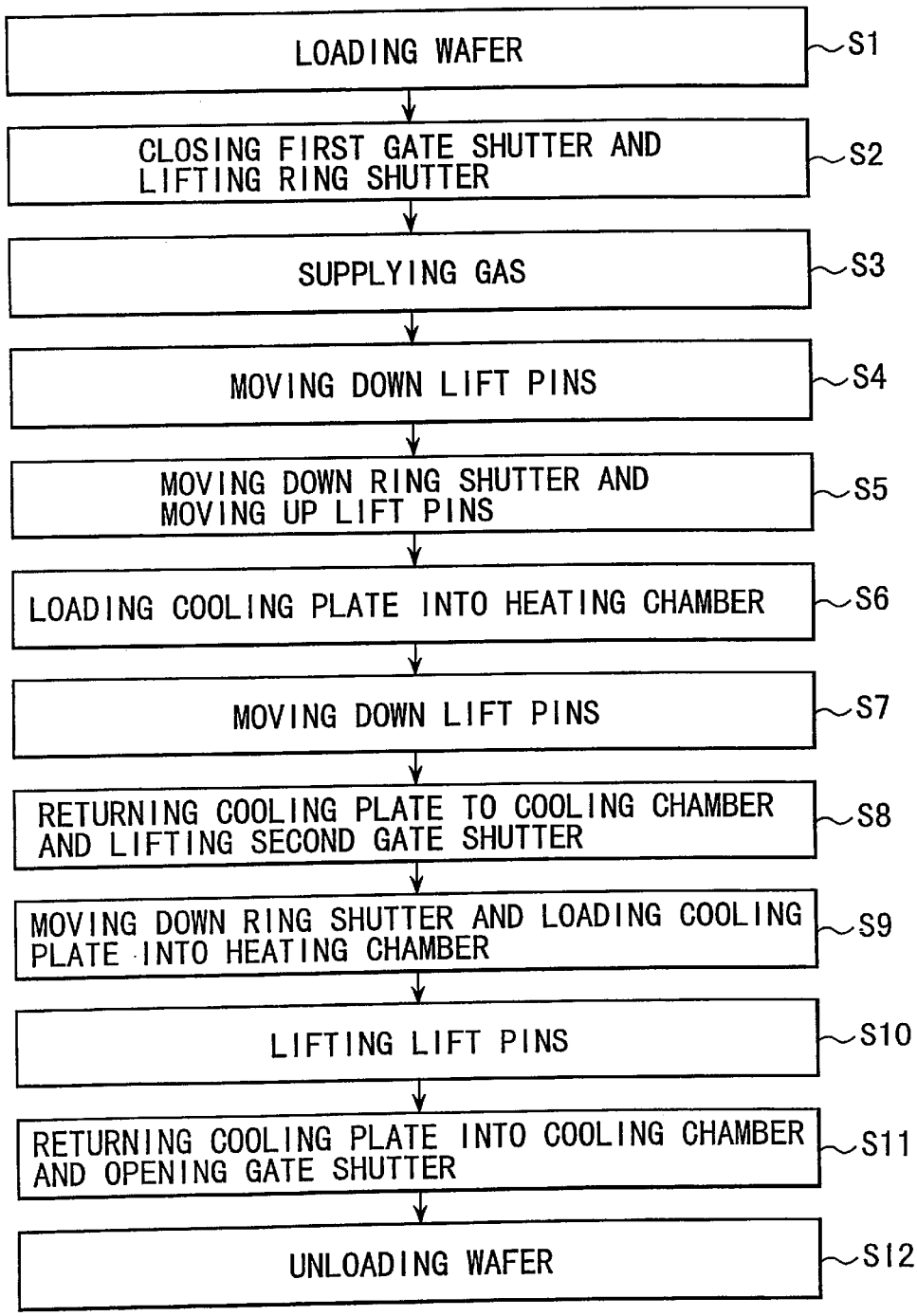
FIG. 7 is a flow chart of curing process (annealing)

In the DCC unit 20, a coating film of the wafer W is heated and cooled in accordance with the steps shown in FIG. 7.

First, the first gate shutter 44 is opened to transfer the wafer W from the main transfer mechanism 18 onto the three lift pins 47 in the heating chamber 41 (Step S1). At this time, exchange of the wafers W is not performed.

Then, the first gate shutter 44 is closed. The ring shutter 46 and the second gate shutter 45 move up, with the result that the wafer W is surrounded by the ring shutter 46 (Step S2). At this time, supply of $N_2$ gas into the heating chamber 41 is initiated (Step S3). The atmosphere of the heating chamber 41 is maintained at a low-oxygen concentration (e.g., 50 ppm or less) by charging the heating chamber 41 with $N_2$ gas.

Thereafter, the lift pins 47 are moved down and the wafer W is placed near the hot plate 43. The wafer W is heated under the atmosphere low in oxygen concentration (e.g., 50 ppm or less) (Step S4). The heating temperature is, for example, 200 to 470° C. At this time, the heating process performed in the heating chamber 41 is not the one performed in a heating furnace but heat radiation using the hot plate 43. Since the hot plate 43 is surrounded by the ring shutter 46, the wafer W is heated uniformly over an entire surface. Since the heating chamber 41 and the cooling chamber 42 are blocked by the second gate shutter 45, the cooling chamber 42 can be prevented from being thermally influenced.

After the heating process is completed, the ring shutter 46 and the second gate shutter 45 are moved down and the lift pins 47 are moved up (Step S5). At this time, while supply of the inner gas such as $N_2$ gas to the heating chamber 41 is terminated, supply of the inert gas such as $N_2$ gas to the cooling chamber 42 is initiated. The oxygen concentration of the atmosphere within the cooling chamber 42 is maintained low (e.g. 50 ppm or less) by charging the cooling chamber 42 with the inert gas.

Thereafter, the cooling plate 53 is moved into the heating chamber 41 and receives the wafer W from the lift pins 47 (Step S6), and then, the lift pins 47 are moved down (Step S7).

Subsequently, the cooling plate 53 is returned to the cooling chamber 42 and the second gate shutter 45 is moved up. The oxygen concentration of the cooling chamber 42 is controlled at, e.g., 50 ppm or less while the oxygen concentration is monitored, at the same time, the wafer W is cooled under the atmosphere low in oxygen concentration (Step S8). The cooling temperature at this time is, for example, 200–400° C. Since the wafer is cooled under the low oxygen atmosphere, oxidation of the interlayer dielectric film is effectively prevented. After completion of the cooling process, the supply of $N_2$ gas to the cooling chamber 42 is terminated.

Thereafter, the second gate shutter 45 is moved down and the cooling plate 53 is loaded into the heating chamber 41 (Step S9). Then, the lift pins 47 are moved up to return the wafer W from the cooling plate 53 to the lift pins 47 (Step S10).

After the wafer W is transferred, the cooling plate 53 is returned to the cooling chamber 42 and simultaneously the first gate shutter 44 is opened (Step S11). Thereafter, the wafer W is returned to the main transfer mechanism 18 (Step S12). In this way, the heating process and cooling process are completed.

When the interlayer dielectric film formed on the wafer W is cured, the heating process and cooling process are performed in a single unit in which the heating chamber and cooling chamber are communicated each other, under the atmosphere low in oxygen concentration. Therefore, oxidation of the interlayer dielectric film can be sufficiently prevented.

The wafers are not heated in a batch, namely, in a furnace, but heated one by one. Therefore, it is possible to accurately control temperature of the wafers one by one. It is further possible to maintain the temperature uniformly over the entire surface when heating. Furthermore, the hating process is carried out by use of the hot plate 43 while using the ring shutter 46. Therefore, the uniformity in temperature over the entire wafer while heating, can be greatly improved. Furthermore, since the wafers are processed one by one, it is possible to control the wafers one by one although the wafers are conventionally controlled in lots. As a result, the yield can be improved.

Then, how to control the DCC unit 20 will be explained.

In the DCC unit 20, the wafer W is heated by the hot plate 43 in the heating chamber 41 up to a temperature within the range of 200–470° C. Since the heating temperature is higher than that used in conventional apparatus, it is difficult to control the hot plate in accordance with the conventionally employed temperature controlling method. More specifically, the temperature of the hot plate 43 is measured by a temperature sensor. However, the temperature controller usually used for the temperature sensor is capable of controlling temperature up to about 500° C. In such a high temperature range, a temperature switch conventionally used as an interlock sensor cannot be used. As a result, when the hot plate is raised in temperature excessively in the DCC unit 20, it is difficult to control temperature of the hot plate in accordance with the conventionally-employed method. Since the processing is performed at a high temperature, operation of a driving system must be monitored.

Figure 8:
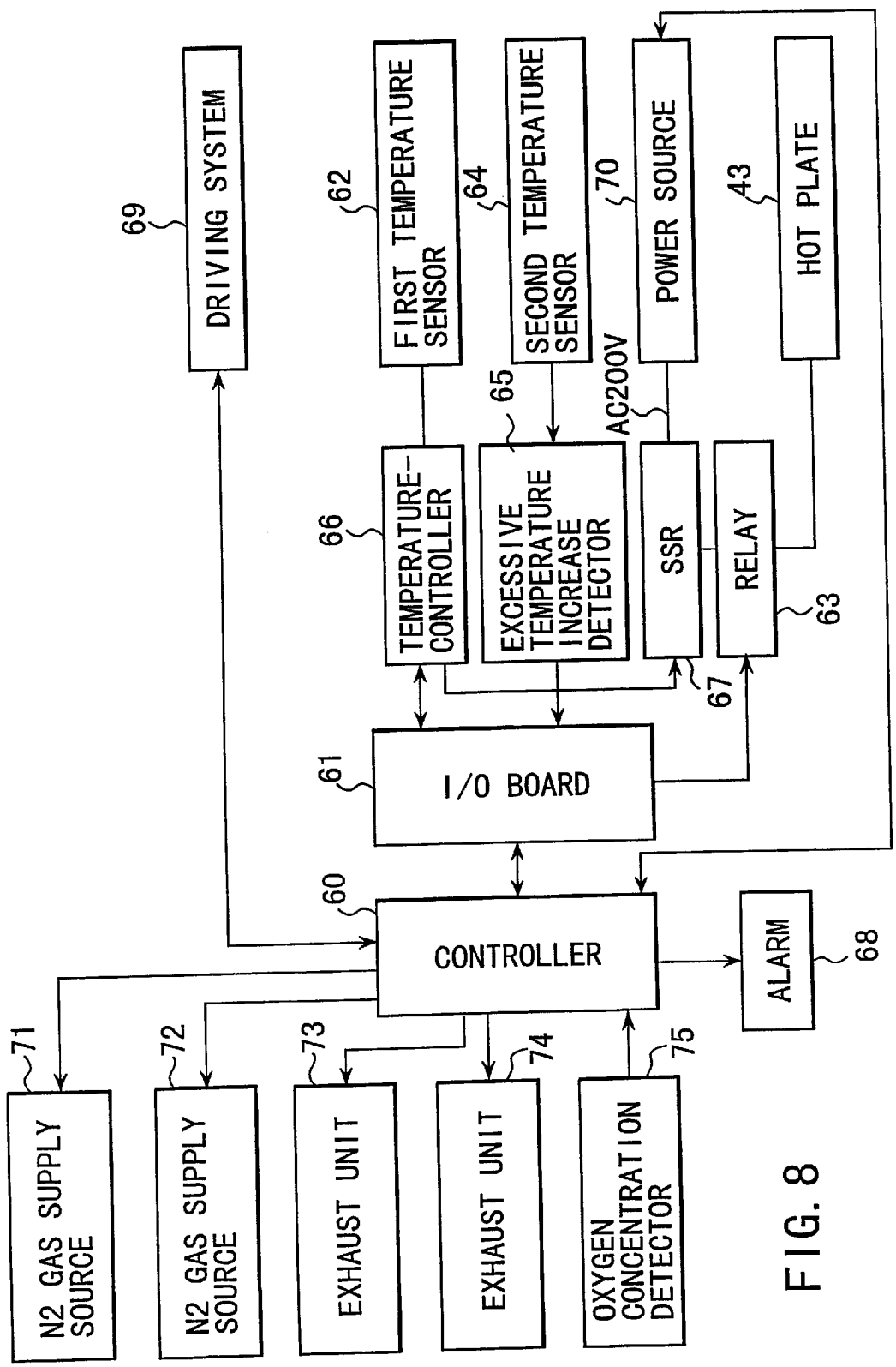
FIG. 8 is a control circuit of the curing apparatus (the DCC unit) according to an embodiment of the present invention.
Figure 9:
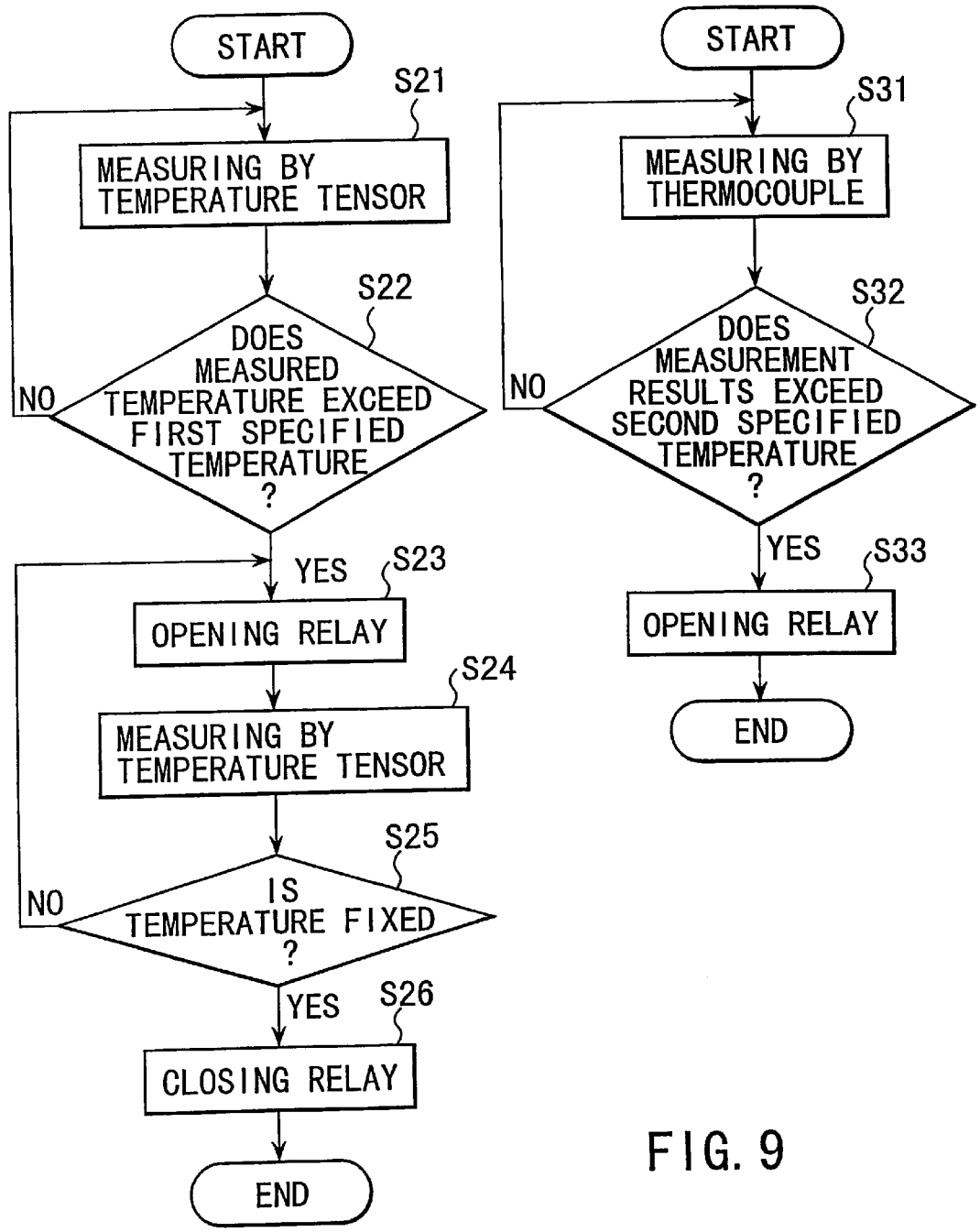
FIG. 9 is a flow chart for temperature control of the hot plate for use in the curing apparatus (DCC unit).

Taking this into consideration, the temperature of the hot plate 43 is controlled in the DCC unit 20, as shown in FIGS. 8 and 9.

In FIG. 8, the controller 60 controls the entire DCC unit 20. To the controller 60, an I/O board 61 is connected. To the I/O board 61, a temperature sensor 62 for measuring temperature of the hot plate 43 is connected via a temperature controller 66. To the temperature controller 66, an alternating current source 70 (200V) and a solid relay (SSR) 67 are connected. The solid relay (SSR) 67 is responsible for opening and closing a power supply route to the hot plate 43. The alternating current source 70 is responsible for supplying power to the hot plate 43.

Furthermore, a thermocouple 64 is provided to measure the temperature of the hot plate 43 even if the temperature of the hot plate 43 exceeds 500° C. which is the uppermost measurement limit of the temperature controller 66. The thermocouple 64 corresponds to the second temperature sensor. The output from the thermocouple 64 is connected to the I/O board 61 by way of an excessive temperature increase detector 65. To the I/O board 61, a relay 63 is connected for opening/shutting a power supply route between and the hot plate 43 and the alternating current source 70 for supplying power to the hot plate on the basis of a signal from the excessive temperature increase detector 65.

In this control system, at normal operation time, the signal (temperature detection signal) based on the temperature of the hot plate 43 measured by the temperature sensor 62 is input into the controller 60 by way of the I/O board 61. At the same time, power is supplied from the power source 70 to the hot plate 43 while the solid relay (SSR) 67 and the relay 63 are closed. As a result, the hot plate 43 is heated. At this time, since output from the power source 70 is controlled by the controller 60, the temperature of the hot plate 43 is controlled.

On the other hand, when the temperature detection signal indicating that the temperature of the hot plate 43 is a first specified temperature of about 490° C. or more is input into the controller 60, an opening signal is output from the controller 60 to the temperature controller 66 by way of the I/O board 61. As a result, the solid relay (SSR) 67 is opened by the signal from the temperature controller 66. In this manner, power is shut off from the power source 70 to the hot plate 43.

When the power supply from the power source 70 to the hot plate 43 is shut off, temperature of the hot plate 43 decreases. When the temperature of the hot plate 43 is fixed to about 490° C. or less (the first specified temperature), a stop signal is output from the controller 60 to the solid relay (SSR) 67 by way of the I/O board 61 and the temperature controller 66 to close the solid relay (SSR) 67. As a result, power supply from the power source 70 to the hot plate 43 is initiated again.

More specifically, when the temperature of the hot plate 43 reaches the first specified temperature of about 490° C. or more, the hot plate 43 is protected by the interlock mechanism on the basis of software. When the temperature of the hot plate 43 is fixed to about 490° C. or less, the heating process can be immediately initiated.

On the other hand, when the thermocouple (second temperature sensor) 64 detects that the temperature of the hot plate 43 is increased to a second specified temperature of about 500° C. or more, the excessive temperature increase detector 65 sends a detection signal directly to the I/O board 61 without passing through the controller 60. The signal is further sent to the relay 63.

As described, when the excessive temperature increase detector 65 detects, on the basis of the signal from the thermocouple 64, that the temperature of the hot plate 43 reaches the second specified temperature of about 500° C. or more, a stop signal is sent to the relay 63 through the I/O board 61. As a result, power supply from the power source 70 to the hot plate 43 is forcibly terminated and this state is maintained until the power source is shut off. When the temperature of the hot plate 43 reaches the second specified temperature of about 500° C. or more, the interlock mechanism prevents the temperature of the hot plate 43 from excessively increasing. Note that the I/O board 61 sends a signal for informing the excessive temperature increase to the controller 60 on the basis of the excessive temperature increase detection signal sent to the I/O board 61.

Furthermore, an alarm mechanism 68 is connected to the controller 60. In the case where the controller 60 receives the signal meaning that the temperature of the hot plate exceeds the first specified temperature of about 490° C., from the temperature sensor 62 through the I/O board 61 and the case where the controller 60 receives the signal meaning that the temperature sent from the excessive temperature increase detector 65 to the I/O board 61 exceeds the second specified temperature of about 500° C., a signal is sent from the controller 60 to the alarm mechanism 68 to generate the alarm.

As shown in FIG. 8, the controller 60 also controls the driving system 69 of the DDC process unit 20. When individual elements of the driving system 69 are not operated in accordance with the instruction from the controller 60, an alarm is generated from the alarm mechanism 68. For example, when the controller 60 recognizes that the operation is not initiated even if three seconds have passed after an operation-initiation signal is output from the controller 60 to the lift pins 47, the ring shutter 46 or the gate shutters 44, 45 of the heating chamber 41, a signal is sent from the controller 60 to the alarm mechanism 68 to generate an alarm. Similarly, a signal is also sent from the controller 60 to an alarm mechanism 68 to generate an alarm when the operation is not initiated even if four or five seconds have passed after the operation-initiation signal is output from the controller 60 to the cooling plate 53 of the cooling chamber 42.

Incidentally, a sensor (not shown) is provided for detecting the cases where a chamber plate is removed and set incorrectly. When the controller 60 receives the signal for ill-fitting of the chamber plate from the sensor, an alarm signal is sent to the alarm mechanism 68 to generate an alarm. In such a case, if the chamber plate is reset correctly, the alarm is automatically released.

Next, referring to FIG. 9, we will explain how to control the hot plate when an abnormality in temperature takes place.

First, the temperature of the hot plate 43 is measured by the temperature sensor 62. A signal is sent from the temperature sensor 62 to the controller 60 by way of the temperature controller 66 and the I/O board 61 (Step S21). Then, it is determined whether or not the temperature of the hot plate 43 is about 490° C. or more on the basis of the signal received by the controller 66 (Step S22). When the temperature of the hot plate is the first specified temperature of about 490° C. or more, an opening signal is output from the controller 60 to the solid relay (SSR) 67 by way of the I/O board 61 and the temperature controller 66. As a result, the solid relay (SSR) 67 is opened to thereby shut off the power supply from the power source 70 to the hot plate 43 (Step S23). At the same time, an alarm is generated from the alarm mechanism 68. On the other hand, when the temperature of the hot plate is less than about 490° C. of the first specified temperature, the measurement of the temperature is continued while the solid relay (SSR) 67 is maintained close.

After the power supply from the power source 70 to the hot plate 43 is shut off by detecting that the temperature of the hot plate exceeds the first specified temperature of about 490° C., then the temperature of the hot plate 43 is further measured by the temperature sensor 62 (Step S24). Then, it is determined whether or not the temperature of the hot plate 43 is decreased and fixed to the first specified temperature of about 490° C. or less (Step S25). When the temperature of the hot plate is fixed to about 490° C. or less, a stop signal is output from the controller 60 to the solid relay (SSR) 67 by way of the I/O board 61 to the temperature controller 66. As a result, the solid relay (SSR) 67 is closed to initiate power supply from the power source 70 to the hot plate 43 (Step S26). On the other hand, while the temperature of the hot plate is not yet fixed to about 490° C. or less, the solid relay (SSR) 67 is maintained open.

Even if the temperature of the hot plate 43 increase to the first specified temperature of about 490° C. or more, it is possible to prevent the temperature of the hot plate 43 from further increasing by the interlock mechanism on the basis of software. When the temperature of the hot plate 43 is decreased to less than about 490° C. by removing problems, the normal temperature control system can immediately work.

When the temperature of the hot plate 43 increases in excess of the first specified temperature of about 490° C. or more for some reason, temperature control is performed as follows:

First, when the temperature of the hot plate 43 increases to the first specified temperature of about 490° C. or more, control of temperature is performed on the basis of data measured by the thermocouple 64. This is because about temperature of 490° C. or more does not fall within a controllable temperature range by the temperature controller 66 (Step S31). Then, the excessive temperature increase detector 65 determines whether or not the temperature of the hot plate 43 measured by the thermocouple 64 is the second specified temperature of about 500° C. or more (Step S3). When the temperature of the hot plate is about 500° C. or more, the signal for temperature measured by the thermocouple 64 is sent from the excessive temperature increase detector 65 to the I/O board 61 and then sent directly to the relay 63 without passing through the controller 60 (Step S33). When the temperature of the hot plate 43 once increases to about 500° C. or more which is the second specified temperature, power supply from the power source 70 to the hot plate 43 is forcibly shut off. The shut off state is maintained until the power source is shut off, and simultaneously, an alarm is generated from the alarm mechanism 68. On the other hand, when the temperature of the hot plate 43 is less than about 500° C., the thermocouple continuously measures the temperature.

As described, if the temperature of the hot plate 43 increases in excess of the second specified temperature of about 500° C. or more, it is possible to prevent the hot plate 43 from being heated excessively since power supply is forcibly terminated mechanically (in hardware).

As mentioned in the foregoing, the apparatus has dual interlock mechanisms, one is in software and the other is in hardware. Therefore, it is possible to prevent excessive heating of the hot plate 43 while the temperature of the hot plate 43 is appropriately controlled at a relatively high temperature.

The power supply route to the hot plate 43 is opened or closed at the solid relay (SSR) 67 or the relay 63. Therefore, when the hot plate 43 is excessively heated, the power supply to the hot plate 43 can be completely shut off. Furthermore, when the power supply to the hot plate 43 is terminated, an alarm is generated by the alarm mechanism 68. It is therefore possible for an operator to immediately know that the temperature of the hot plate 43 is too high. Thus, the operator can immediately take appropriate procedures to deal with it.

Furthermore, an inert gas such as $N_2$ gas is supplied to each of the heating chamber 41 and the cooling chamber 42 and simultaneously exhausted therefrom. It is therefore possible to treat a wafer in the atmosphere low in oxygen concentration while another wafer is load/unload.

The present invention is not limited to the aforementioned embodiments and may be modified in various ways. For example, the substrate to be processed is not limited to a semiconductor wafer. Other substrates including an LCD substrate may be used. The coating film is not limited to the interlayer dielectric film. Any film may be applicable as long as the film is required to be cured by heating after coating in an atmosphere low in oxygen concentration.

According to the present invention, the heating process and the cooling process can be continuously performed in an atmosphere low in oxygen concentration. As a result, oxidization of the coating film can be sufficiently prevented. Since the wafers W are processed one by one in the heating chamber, it is possible to accurately control the temperature of the wafers one by one. As a result, the heating process can be applied uniformly to the entire surface of the wafer. Since the wafers are processed one by one, the wafers can be controlled one by one unlike a conventional method in which the wafers are controlled in lots. Consequently, the yield can be improved.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. An apparatus configured to form a coating film, comprising:

a coating unit configured to coat a coating film by applying a coating solution onto a substrate; and a curing unit configured to cure the coating film by applying a heating process and a cooling process to the substrate, wherein the curing unit comprises:

a heating chamber having a hot plate configured to controllably heat substrates having the coating solution applied thereon, one by one;

a ring shutter configured to surround the substrate to be heated by the hot plate to a predetermined temperature;

a cooling chamber communicated with the heating chamber and having a cooling plate configured to cool the substrate processed with heat;

a moving mechanism configured to move the cooling plate from the cooling chamber to the heating chamber;

an inert gas supply mechanism configured to supply an inert gas to the heating chamber and the cooling chamber; and an evacuation mechanism having a first evacuation passage communicating with the heating chamber and a second evacuation passage communicating with the cooling chamber;

an oxygen concentration detector having a first oxygen sensor provided in the first evacuation passage configured to detect oxygen present in a gas exhausted from the heating chamber, and a second oxygen sensor provided in the second evacuation passage configured to detect oxygen present in a gas exhausted from the cooling chamber; and a controller configured to:
control operations of the inert gas supply mechanism and the evacuation mechanism so as to keep a balance between a supply amount of an inert gas supplied by said inert gas supply mechanism and an exhaust amount of gas exhausted by the evacuation mechanism, thereby adjusting inner pressures of the heating chamber and the cooling chamber, obtain a first oxygen concentration in the heating chamber based on a detection signal from the first oxygen sensor, and obtain a second oxygen concentration in the cooling chamber based on a detection signal from the second oxygen sensor.

2. The apparatus according to claim 1, wherein the curing unit has a shutter up-and-down moving mechanism for moving the ring shutter up and down, and a gate shutter connected to the ring shutter and moveable up and down in synchronization with the movement of the ring shutter by the shutter up-and-down mechanism for blocking between the heating chamber and the cooling chamber.

3. The apparatus according to claim 1, wherein the inert gas supply mechanism has an inert gas supply unit in each of the heating chamber and the cooling chamber; and the evacuation mechanism has an evacuation unit in each of the heating chamber and the cooling chamber.

4. The apparatus according to claim 1, wherein the heating chamber has a plurality of pins for lifting the substrate from the hot plate and an elevating mechanism for moving the pins upward and downward.

5. The apparatus according to claim 1, wherein the coating unit has a coating solution supply source for supplying a coating solution for forming an interlayer dielectric film to the substrate.

6. The apparatus according to claim 1, further comprising:
a power source configured to supply power to the hot plate;
first and second temperature sensors each configured to detect a temperature of the hot plate;
a temperature-controller configured to control the power source based on a detection signal supplied from the first temperature sensor;
a controller configured to set a first specified temperature which is an upper limit of a temperature range suitable to cure the coating solution, and to compare the first specified temperature with a detection signal supplied from the first temperature sensor each time the detection signal is input, said controller supplying a control signal to the temperature-controller to stop power supply from the power source to the hot plate when a detection temperature corresponding to the detection signal is higher than the first specified temperature, said controller resuming the power supply from the power source to the hot plate when the detection temperature is not higher than the first specified temperature;
an excessive temperature increase detector configured to set a second specified temperature higher than the first specified temperature and to stop the power supply from the power source to the hot plate and to maintain a non power supply state when the temperature detected by the second temperature sensor is higher than the second specified temperature; and
a relay configured to receive and supply signals to the temperature controller, the controller, the excessive temperature increase detector and the hot plate, and configured to open a feeding circuit that extends from the power source to the hot plate,
wherein said controller outputs a circuit opening signal to the relay when power feed from the power source to the hot plate is stopped, and
wherein said excessive temperature increase detector outputs a circuit opening signal to the relay when the power feed from the power source to the hot plate is stopped.

7. The apparatus according to claim 1, further comprising:
a power source configured to supply power to the hot plate;
first and second temperature sensors each configured to detect a temperature of the hot plate;
a temperature-controller configured to control the power source based on a detection signal supplied from the first temperature sensor;
a controller configured to set a first specified temperature which is an upper limit of a temperature range suitable to cure the coating solution, and to compare the first specified temperature with a detection signal supplied from the first temperature sensor each time the detection signal is input, said controller supplying a control signal to the temperature-controller to stop power supply from the power source to the hot plate when a detection temperature corresponding to the detection signal is higher than the first specified temperature, said controller resuming the power supply from the power source to the hot plate when the detection temperature is not higher than the first specified temperature;
an excessive temperature increase detector configured to set a second specified temperature higher than the first specified temperature and to stop the power supply from the power source to the hot plate and to maintain a non power supply state when the temperature detected by the second temperature sensor is higher than the second specified temperature; and
a relay configured to receive and supply signals to the temperature controller, the controller, the excessive temperature increase detector and the hot plate, and configured to close a feeding circuit that extends from the power source to the hot plate,
wherein said controller outputs a circuit opening signal to the relay when power feed from the power source to the hot plate is stopped, and
wherein said excessive temperature increase detector outputs a circuit opening signal to the relay when the power feed from the power source to the hot plate is stopped.

8. The apparatus according to claim 1, wherein said ring shutter comprises an inner peripheral surface facing the substrate on the hot plate and a plurality of holes for supplying an inert gas toward the substrate.

9. The apparatus according to claim 1, wherein said coating solution is a Spin on Dielectric, which is cured under heating in a substantially oxygen-free atmosphere to form an interlayer dielectric film on the substrate.

10. An apparatus configured to cure a coating film applied on a substrate by heating processing, comprising:
a heating chamber having a hot plate configured to controllably heat substrates coated with a coating solution, one by one;

a ring shutter configured to surround the substrate to be heated by the hot plate to a predetermined temperature;

a cooling chamber communicating with the heating chamber and having a cooling plate configured to cool the substrate processed with heat;

a moving mechanism configured to move the cooling plate from the cooling chamber to the heating chamber;

an inert gas supply mechanism configured to supply an inert gas to the heating chamber and the cooling chamber; and an evacuation mechanism having a first evacuation passage communicating with the heating chamber and a second evacuation passage communicating with the cooling chamber;

an oxygen concentration detector having a first oxygen sensor provided in the first evacuation passage configured to detect oxygen present in a gas exhausted from the heating chamber, and a second oxygen sensor provided in the second evacuation passage configured to detect oxygen present in a gas exhausted from the cooling chamber; and a controller configured to:
control operations of the inert gas supply mechanism and the evacuation mechanism so as to keep a balance between a supply amount of an inert gas supplied by said inert gas supply mechanism and an exhaust amount of gas exhausted by the evacuation mechanism, thereby adjusting inner pressures of the heating chamber and the cooling chamber, obtain a first oxygen concentration in the heating chamber based on a detection signal from the first oxygen sensor, and obtain a second oxygen concentration in the cooling chamber based on a detection signal from the second oxygen sensor.

11. The apparatus according to claim 10, further comprising a shutter up-and-down moving mechanism for moving the ring shutter up and down, and a gate shutter connected to the ring shutter moveable up and down in synchronization with the movement of the ring shutter by the shutter up-and-down mechanism for blocking between the heating chamber and the cooling chamber.

12. The apparatus according to claim 10, wherein the inert gas supply mechanism has an inert gas supply unit in each of the heating chamber and the cooling chamber, and
the evacuation mechanism has an evacuation unit in each of the heating chamber and the cooling chamber.

13. The apparatus according to claim 10, wherein the heating chamber further has a plurality of pins for lifting the substrate from the hot plate and an elevating mechanism for moving the pins upward and downward.

14. The apparatus according to claim 10, further comprising:

a power source configured to supply power to the hot plate;

first and second temperature sensors each configured to detect a temperature of the hot plate;

a temperature-controller configured to control the power source based on a detection signal supplied from the first temperature sensor;

a controller configured to set a first specified temperature which is an upper limit of a temperature range suitable to cure the coating solution, and to compare the first specified temperature with a detection signal supplied from the first temperature sensor each time the detection signal is input, said controller supplying a control signal to the temperature-controller to stop power supply from the power source to the hot plate when a detection temperature corresponding to the detection signal is higher than the first specified temperature, said controller resuming the power supply from the power source to the hot plate when the detection temperature is not higher than the first specified temperature;

an excessive temperature increase detector configured to set a second specified temperature higher than the first specified temperature, to stop the power supply from the power source to the hot plate, and to maintain a state of non power supply when the temperature detected by the second temperature sensor is higher than the second specified temperature; and a relay configured to receive and supply signals to the temperature controller, the controller, the excessive temperature increase detector, and the hot plate, and configured to open a feeding circuit that extends from the power source to the hot plate, wherein said controller outputs a circuit opening signal to the relay when power feed from the power source to the hot plate is stopped, and wherein said excessive temperature increase detector outputs a circuit opening signal to the relay when the power feed from the power source to the hot plate is stopped.

15. The apparatus according to claim 14, further comprising an alarm unit for generating an alarm on the basis of a signal from the controller when the power supply from the power source to the hot plate is terminated.

16. The apparatus according to claim 10, further comprising:

a power source configured to supply power to the hot plate;

first and second temperature sensors each configured to detect a temperature of the hot plate;

a temperature-controller configured to control the power source based on a detection signal supplied from the first temperature sensor;

a controller configured to set a first specified temperature which is an upper limit of a temperature range suitable to cure the coating solution, and to compare the first specified temperature with a detection signal supplied from the first temperature sensor each time the detection signal is input, said controller supplying a control signal to the temperature-controller to stop power supply from the power source to the hot plate when a detection temperature corresponding to the detection signal is higher than the first specified temperature, said controller resuming the power supply from the power source to the hot plate when the detection temperature is not higher than the first specified temperature;

an excessive temperature increase detector configured to set a second specified temperature higher than the first specified temperature, to stop the power supply from the power source to the hot plate, and to maintain a state of non power supply when the temperature detected by the second temperature sensor is higher than the second specified temperature; and a relay configured to receive and supply signals to the temperature controller, the controller, the excessive temperature increase detector, and the hot plate, and configured to close a feeding circuit that extends from the power source to the hot plate, wherein said controller outputs a circuit opening signal to the relay when power feed from the power source to the hot plate is stopped, and wherein said excessive temperature increase detector outputs a circuit opening signal to the relay when the power feed from the power source to the hot plate is stopped.

17. The apparatus according to claim 10, wherein said ring shutter comprises an inner peripheral surface facing the substrate on the hot plate and a plurality of holes for supplying an inert gas toward the substrate.

18. The apparatus according to claim 10, wherein said coating solution is a Spin on Dielectric, which is cured under heating in a substantially oxygen-free atmosphere to form an interlayer dielectric film on the substrate.

* * * * *